US008815331B2

(12) United States Patent
Yamazaki et al.

(10) Patent No.: US 8,815,331 B2
(45) Date of Patent: Aug. 26, 2014

(54) FILM-FORMING APPARATUS, METHOD OF CLEANING THE SAME, AND METHOD OF MANUFACTURING A LIGHT-EMITTING DEVICE

(75) Inventors: Shunpei Yamazaki, Tokyo (JP); Toru Takayama, Kanagawa (JP); Takeshi Fukunaga, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/449,396

(22) Filed: Apr. 18, 2012

(65) Prior Publication Data

US 2012/0201955 A1 Aug. 9, 2012

Related U.S. Application Data

(60) Continuation of application No. 12/686,624, filed on Jan. 13, 2010, now abandoned, and a continuation of application No. 11/377,730, filed on Mar. 17, 2006, now Pat. No. 7,674,497, and a division of application No. 10/750,854, filed on Jan. 5, 2004, now Pat. No. 7,015,154, and a division of application No. 09/818,513, filed on Mar. 28, 2001, now abandoned.

(30) Foreign Application Priority Data

May 2, 2000 (JP) .................................. 2000-133221
May 2, 2000 (JP) .................................. 2000-133229

(51) Int. Cl.
*C23C 14/56* (2006.01)
*C23C 14/24* (2006.01)
*C23C 14/04* (2006.01)
*C23C 14/12* (2006.01)
*C23C 14/54* (2006.01)

(52) U.S. Cl.
CPC .......... *C23C 14/564* (2013.01); *C23C 14/243* (2013.01); *C23C 14/04* (2013.01); *C23C 14/12* (2013.01); *C23C 14/54* (2013.01)
USPC .............................. 427/69; 427/592; 427/593

(58) Field of Classification Search
USPC .............. 427/69, 593, 248.1, 255.6; 118/715, 118/727
See application file for complete search history.

(56) References Cited

U.S. PATENT DOCUMENTS 2,351,536 A 6/1944 Osterberg et al.
2,435,997 A * 2/1948 Bennett ........................ 118/727
(Continued)

FOREIGN PATENT DOCUMENTS

DE 2834806 2/1980
DE 4422697 1/1996
(Continued)

OTHER PUBLICATIONS

Tang.C et al., "Organic Electroluminescent Diodes,", Appl. Phys. Lett. (Applied Physics Letters), Sep. 21, 1987, vol. 51, No. 12, pp. 913-915.

(Continued)

*Primary Examiner* — David Turocy
(74) *Attorney, Agent, or Firm* — Nixon Peabody LLP; Jeffrey L. Costellia

(57) ABSTRACT

A cleaning method of removing a vapor-deposition material adhering to equipments without exposure to the atmosphere is provided. A vapor-deposition material adhering to equipments (components of a film-forming apparatus) such as a substrate holder, a vapor-deposition mask, a mask holder, or an adhesion preventing shield provided in a film-forming chamber are subjected to heat treatment. Because of this, the adhering vapor-deposition material is re-sublimated, and removed by exhaust through a vacuum pump. By including such a cleaning method in the steps of manufacturing an electro-optical device, the manufacturing steps are shortened, and an electro-optical device with high reliability can be realized.

21 Claims, 12 Drawing Sheets

(56) References Cited

U.S. PATENT DOCUMENTS

| | | | |
|---|---|---|---|
| 3,110,620 A | 11/1963 | Bertelsen | |
| 3,235,647 A | 2/1966 | Hanks | |
| 3,312,190 A | 4/1967 | Bradshaw | |
| 3,420,977 A | 1/1969 | Hanks et al. | |
| 3,543,717 A | 12/1970 | Adachi | |
| 3,636,305 A | 1/1972 | Passmore | |
| 3,710,072 A | 1/1973 | Shrader et al. | |
| 3,756,193 A | 9/1973 | Carmichael et al. | |
| 3,931,490 A | 1/1976 | Grothe et al. | |
| 3,931,789 A | 1/1976 | Kakei et al. | |
| 3,971,334 A | 7/1976 | Pundsack | |
| 4,023,523 A | 5/1977 | Ing | |
| 4,187,801 A | 2/1980 | Monk | |
| 4,225,805 A | 9/1980 | Smithgall et al. | |
| 4,233,937 A * | 11/1980 | Steube | 118/727 |
| 4,405,487 A | 9/1983 | Harrah et al. | |
| 4,446,357 A | 5/1984 | Barshter | |
| 4,469,719 A | 9/1984 | Martin | |
| 4,529,475 A | 7/1985 | Okano et al. | |
| 4,543,467 A | 9/1985 | Eisele et al. | |
| 4,592,306 A | 6/1986 | Gallego | |
| 4,596,735 A | 6/1986 | Noguchi et al. | |
| 4,602,192 A | 7/1986 | Nomura et al. | |
| 4,627,989 A * | 12/1986 | Feuerstein et al. | 427/10 |
| 4,672,265 A | 6/1987 | Eguchi et al. | |
| 4,769,292 A | 9/1988 | Tang et al. | |
| 4,885,211 A | 12/1989 | Tang et al. | |
| 4,897,290 A | 1/1990 | Terasaka et al. | |
| 4,910,436 A | 3/1990 | Collins et al. | |
| 4,951,601 A | 8/1990 | Maydan et al. | |
| 5,094,880 A | 3/1992 | Hongoh | |
| 5,104,695 A * | 4/1992 | Greer et al. | 427/250 |
| 5,111,022 A | 5/1992 | Harper et al. | |
| 5,190,590 A | 3/1993 | Suzuki et al. | |
| 5,258,325 A | 11/1993 | Spitzer et al. | |
| 5,259,881 A | 11/1993 | Edwards et al. | |
| 5,304,406 A | 4/1994 | Hongo | |
| 5,310,410 A | 5/1994 | Begin et al. | |
| 5,429,884 A | 7/1995 | Namiki et al. | |
| 5,512,102 A | 4/1996 | Yamazaki | |
| 5,512,320 A | 4/1996 | Turner et al. | |
| 5,529,630 A | 6/1996 | Imahashi et al. | |
| 5,534,314 A | 7/1996 | Wadley et al. | |
| 5,550,066 A | 8/1996 | Tang et al. | |
| 5,571,335 A | 11/1996 | Lloyd | |
| 5,629,922 A | 5/1997 | Moodera et al. | |
| 5,630,917 A | 5/1997 | Guo | |
| 5,643,685 A | 7/1997 | Torikoshi | |
| 5,650,013 A | 7/1997 | Yamazaki | |
| 5,670,792 A | 9/1997 | Utsugi et al. | |
| 5,679,215 A | 10/1997 | Barnes et al. | |
| 5,688,551 A | 11/1997 | Littman et al. | |
| 5,701,055 A | 12/1997 | Nagayama et al. | |
| 5,759,640 A | 6/1998 | Mannava et al. | |
| 5,779,937 A * | 7/1998 | Sano et al. | 252/301.16 |
| 5,817,366 A | 10/1998 | Arai et al. | |
| 5,827,408 A | 10/1998 | Raaijmakers | |
| 5,844,363 A | 12/1998 | Gu et al. | |
| 5,902,688 A | 5/1999 | Antoniadis et al. | |
| 5,904,872 A | 5/1999 | Arami et al. | |
| 5,904,961 A | 5/1999 | Tang et al. | |
| 5,906,857 A | 5/1999 | McKee et al. | |
| 5,921,836 A | 7/1999 | Nanto et al. | |
| 5,935,395 A | 8/1999 | Ouellet et al. | |
| 5,943,600 A | 8/1999 | Ngan et al. | |
| 5,945,967 A | 8/1999 | Rallison et al. | |
| 5,972,183 A | 10/1999 | Krueger et al. | |
| 5,993,614 A | 11/1999 | Nomura | |
| 6,001,413 A | 12/1999 | Matsuura et al. | |
| 6,011,904 A | 1/2000 | Mattord | |
| 6,023,308 A | 2/2000 | Takemura | |
| 6,049,167 A | 4/2000 | Onitsuka et al. | |
| 6,069,095 A | 5/2000 | Haider | |
| 6,080,643 A | 6/2000 | Noguchi et al. | |
| 6,101,316 A | 8/2000 | Nagashima et al. | |
| 6,124,215 A | 9/2000 | Zheng | |
| 6,132,280 A | 10/2000 | Tanabe et al. | |
| 6,132,805 A | 10/2000 | Moslehi | |
| 6,149,392 A | 11/2000 | Conte | |
| 6,179,923 B1 * | 1/2001 | Yamamoto et al. | 118/719 |
| 6,237,529 B1 | 5/2001 | Spahn | |
| 6,244,212 B1 | 6/2001 | Takacs et al. | |
| 6,274,887 B1 | 8/2001 | Yamazaki et al. | |
| 6,275,649 B1 | 8/2001 | Nagashima et al. | |
| 6,280,861 B1 | 8/2001 | Hosokawa et al. | |
| 6,294,892 B1 | 9/2001 | Utsugi et al. | |
| 6,296,894 B1 | 10/2001 | Tanabe et al. | |
| 6,299,746 B1 | 10/2001 | Conte et al. | |
| 6,319,321 B1 | 11/2001 | Hiraga et al. | |
| 6,326,726 B1 | 12/2001 | Mizutani et al. | |
| 6,333,065 B1 | 12/2001 | Arai et al. | |
| 6,337,105 B1 | 1/2002 | Kunieda et al. | |
| 6,340,501 B1 | 1/2002 | Kamiyama et al. | |
| 6,366,346 B1 * | 4/2002 | Nowak et al. | 356/72 |
| 6,380,081 B1 | 4/2002 | Lee | |
| 6,403,392 B1 | 6/2002 | Burrows et al. | |
| 6,432,561 B1 | 8/2002 | Yamazaki | |
| 6,469,439 B2 | 10/2002 | Himeshima et al. | |
| 6,482,752 B1 | 11/2002 | Yamazaki et al. | |
| 6,482,852 B2 | 11/2002 | Shakespeare et al. | |
| 6,495,198 B2 | 12/2002 | Peng | |
| 6,503,564 B1 | 1/2003 | Fleming et al. | |
| 6,504,215 B1 | 1/2003 | Yamanaka et al. | |
| 6,528,108 B1 | 3/2003 | Kawamura | |
| 6,537,607 B1 | 3/2003 | Swanson | |
| 6,559,036 B1 | 5/2003 | Ohtani et al. | |
| 6,633,121 B2 | 10/2003 | Eida et al. | |
| 6,641,674 B2 | 11/2003 | Peng | |
| 6,649,210 B2 | 11/2003 | Tokailin et al. | |
| 6,660,409 B1 | 12/2003 | Komatsu et al. | |
| 6,673,262 B1 | 1/2004 | Mori et al. | |
| 6,682,600 B2 | 1/2004 | Marcus et al. | |
| 6,696,096 B2 | 2/2004 | Tsubaki et al. | |
| 6,776,880 B1 | 8/2004 | Yamazaki | |
| 6,830,626 B1 | 12/2004 | Smith | |
| 7,015,154 B2 | 3/2006 | Yamazaki et al. | |
| 7,168,436 B2 | 1/2007 | Mouri et al. | |
| 7,744,769 B2 | 6/2010 | Mouri et al. | |
| 8,119,189 B2 | 2/2012 | Yamazaki et al. | |
| 2001/0006827 A1 | 7/2001 | Yamazaki et al. | |
| 2001/0009154 A1 | 7/2001 | Nguyen et al. | |
| 2001/0022272 A1 | 9/2001 | Plester et al. | |
| 2002/0009538 A1 | 1/2002 | Arai | |
| 2002/0011205 A1 | 1/2002 | Yamazaki et al. | |
| 2002/0076847 A1 | 6/2002 | Yamada et al. | |
| 2002/0081372 A1 | 6/2002 | Peng | |
| 2002/0084032 A1 | 7/2002 | Jeng et al. | |
| 2002/0155632 A1 | 10/2002 | Yamazaki et al. | |
| 2002/0179013 A1 | 12/2002 | Kido et al. | |
| 2002/0192499 A1 | 12/2002 | Tokailin et al. | |
| 2002/0197418 A1 | 12/2002 | Mizukami et al. | |
| 2002/0197760 A1 | 12/2002 | Yamazaki et al. | |
| 2003/0015140 A1 | 1/2003 | Van Slyke et al. | |
| 2003/0017259 A1 | 1/2003 | Yamada et al. | |
| 2003/0024479 A1 | 2/2003 | Kashiwaya et al. | |
| 2003/0101937 A1 | 6/2003 | Van Slyke et al. | |
| 2003/0196597 A1 | 10/2003 | Yamazaki | |
| 2004/0035366 A1 | 2/2004 | Keum et al. | |
| 2004/0096694 A1 | 5/2004 | Tokailin et al. | |
| 2004/0139984 A1 | 7/2004 | Yamazaki et al. | |
| 2005/0005850 A1 | 1/2005 | Yamazaki | |
| 2005/0208697 A1 | 9/2005 | Seo et al. | |
| 2010/0021624 A1 | 1/2010 | Yamazaki et al. | |

FOREIGN PATENT DOCUMENTS

| | | | |
|---|---|---|---|
| EP | 652303 A1 * | 5/1995 | |
| EP | 0 865 229 A2 | 9/1998 | |
| EP | 0924282 A | 6/1999 | |
| EP | 0 955 791 A1 | 11/1999 | |
| EP | 1 071 117 A2 | 1/2001 | |
| JP | 54-127877 | 10/1979 | |
| JP | 57-123973 | 8/1982 | |
| JP | 58-177463 | 10/1983 | |

(56) References Cited

FOREIGN PATENT DOCUMENTS

| | | |
|---|---|---|
| JP | 60-032361 | 3/1985 |
| JP | 60-121616 | 6/1985 |
| JP | 63-079959 | 4/1988 |
| JP | 63-186763 | 11/1988 |
| JP | 64-042392 | 2/1989 |
| JP | 02-173261 | 7/1990 |
| JP | 04-116169 | 4/1992 |
| JP | 05-179436 | 7/1993 |
| JP | 05-304197 | 11/1993 |
| JP | 06-088233 | 3/1994 |
| JP | 06-212425 A | 8/1994 |
| JP | 06-306181 | 11/1994 |
| JP | 07-192866 | 7/1995 |
| JP | 07-252671 | 10/1995 |
| JP | 08-111285 | 4/1996 |
| JP | 09-016960 | 1/1997 |
| JP | 09-209127 | 8/1997 |
| JP | 09-256142 | 9/1997 |
| JP | 10-041069 | 2/1998 |
| JP | 10-050478 | 2/1998 |
| JP | 10-168559 | 6/1998 |
| JP | 10-195639 | 7/1998 |
| JP | 10-214682 | 8/1998 |
| JP | 10-255973 | 9/1998 |
| JP | 10-317139 | 12/1998 |
| JP | 10-335062 | 12/1998 |
| JP | 11-061386 | 3/1999 |
| JP | 11-158605 | 6/1999 |
| JP | 11-229123 | 8/1999 |
| JP | 11-236561 A | 8/1999 |
| JP | 2000-348859 | 12/2000 |
| JP | 2001-015472 | 1/2001 |
| JP | 2001-291589 A | 10/2001 |
| JP | 2002-075638 | 3/2002 |
| JP | 2002-105622 | 4/2002 |
| WO | WO 98/54375 A1 | 12/1998 |
| WO | WO 01/31081 A1 | 5/2001 |
| WO | WO 01/79581 A1 | 10/2001 |

OTHER PUBLICATIONS

Van Slyke.S et al., "Blue Organic Light Emitting Devices,", Proceedings of the Electroluminescence Workshop, 1996, pp. 195-200.

Fukuda.Y et al., "An Organic LED Display Exhibiting Pure RGB Colors,", Synthetic Metals, 2000, vol. 111-112, pp. 1-6.

Definition of "Elongated", , Merriam-Webster's Collegiate Dictionary, Tenth Editon, 1998, p. 375, Merriam-Webster.

Slyke.S et al., "Linear Source Deposition of Organic Layers for Full-Color OLED,", SID Digest '02 : SID International Symposium Digest of Technical Papers, 2002, vol. 32, pp. 886-889.

Slyke, S et al., "Linear Source Deposition of Organic Layers for Full-Color OLED,", SID Digest '02; SID International Symposium Digest of Technical Papers, 2002, vol. 33, pp. 886-889.

\* cited by examiner

FILM-FORMING APPARATUS, METHOD OF CLEANING THE SAME, AND METHOD OF MANUFACTURING A LIGHT-EMITTING DEVICE

TECHNICAL FIELD TO WHICH THE INVENTION BELONGS

The present invention relates to a film-forming apparatus used for forming a film of a material (hereinafter, referred to as a "vapor-deposition material") that can be formed into a film by vapor deposition, a method of cleaning the same, and a method of manufacturing an electro-optical device using the cleaning method. In particular, the present invention is a technique effective in the case of using an organic material as a vapor-deposition material.

In the present specification, an electro-optical device intends to include a solar battery, a CCD (charge coupled device), a CMOS sensor, a liquid crystal display apparatus, an EL display apparatus, or a light source including an EL element (these will be collectively referred to as a "light-emitting device").

PRIOR ART

In recent years, a light-emitting element (hereinafter, referred to as an "EL element") using an electro luminescent material (hereinafter, referred to as an "EL material") that can obtain EL (electro luminescence) is being rapidly developed. In particular, an organic type EL material (hereinafter, referred to as an "organic EL material") allows an EL element with a low driving voltage to be manufactured, so that such a material is expected to be applied to the next generation display.

Note that, in the present specification, an EL element refers to a light-emitting element having a structure in which a layer (hereinafter, referred to as an "EL layer") containing an EL material and an organic material or an inorganic material for injecting carriers into the EL material is interposed between two electrodes (positive electrode and negative electrode), i.e., a diode composed of a positive electrode, a negative electrode, and an EL layer.

An EL element using an organic EL material generally utilises an EL layer composed of a combination of an organic EL material and an organic material. The organic EL material and the organic material are roughly classified into a low-molecular type (monomer type) material and a high-molecular type (polymer type) material. Among them, a low-molecular type material is mainly formed into a film by vapor deposition.

The organic EL material is very likely to degrade, and is easily oxidized in the presence of oxygen or water to degrade. Therefore, the organic EL material cannot be subjected to photolithography after being formed into a film. In order to pattern the film, it is required to isolate it simultaneously with the formation thereof, using a mask (hereinafter, referred to as a "vapor-deposition mask") having an opening. Accordingly, most of the sublimated organic EL material adheres to a vapor-deposition mask or an adhesion preventing shield (protective plate for preventing a vapor-deposition material from adhering to an inner wall of a film-forming chamber) in a film-forming chamber.

In order to remove an organic EL material adhering to the vapor-deposition mask or the adhesion preventing shield, it is required to once expose the film-forming chamber to the atmosphere, take the vapor-deposition mask and the adhesion preventing shield out of the chamber, clean them, and return them into the film-forming chamber. However, there is a concern that water or oxygen adsorbed to the vapor-deposition mask and the adhesion preventing shield exposed to the atmosphere may be desorbed during the formation of a film of the organic EL material and taken into the film, which can be a factor for promoting degradation of the organic EL material.

In this case, by conducting vacuum heating under the condition that the vapor-deposition mask and the adhesion preventing shield are set, it is possible to remove adsorbed water or oxygen to some degree. However, vacuum heating for a long period of time causes a decrease in throughput.

SUMMARY OF THE INVENTION

An object of the present invention is to provide a cleaning method of removing a vapor-deposition material adhering to equipments or an inner wall of a film-forming chamber to which the vapor-deposition material may adhere without exposure to the atmosphere, a film-forming apparatus equipped with a mechanism for conducting the cleaning method, and a method of manufacturing an electro-optical device including the cleaning method. In the present specification, equipments (components of a film-forming apparatus) provided in the film-forming apparatus include a substrate holder, a mask holder, an adhesion preventing shield, or a vapor-deposition mask.

The present invention is characterized in that a vapor-deposition material adhering to equipments provided in a film-forming apparatus or an inner wand the film-forming apparatus is sublimated again by heating, and the re-sublimated vapor-deposition material is exhausted through a vacuum pump. As heating means, a method of heating with radiation heat, a method of heating with infrared light, or a method of heating with UV-light can be used. The method of heating with radiation heat may also be specifically referred to as a method of heating with an electric heating wire (metal line with a high electric resistance).

Note that it is also preferable that when the vapor-deposition material adhering to the equipments or the like is sublimated again, gas highly reactive to the vapor-deposition material is flowed in the film-forming chamber, whereby the re-sublimated vapor-deposition material is prevented from adhering to the equipments or the like again. More specifically, gas containing a halogen-group element (fluorine, chlorine, bromine, or iodine) may be flowed. Further, it is also effective to heat the entire portion that comes into contact with the vapor-deposition material to prevent the vapor-deposition material from adhering to the equipments or the like again. At this time, the portion may be typically heated with radiation heat.

Further, in the present specification, sublimating again a vapor-deposition material adhering to a vapor-deposition mask or an inner wall of a film-forming chamber by heating is referred to as "re-sublimation", and a vapor-deposition material that is sublimated again is referred to as a re-sublimated vapor-deposition material.

EMBODIMENTS

Figure 1A:
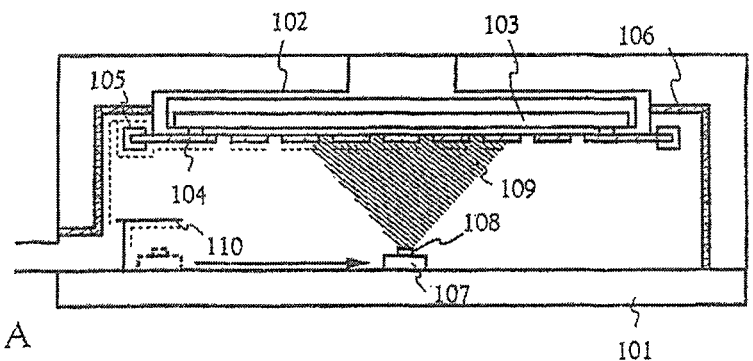
[FIGS. 1A-1C] Views showing cross-sectional structures of a film-forming chamber according to the present invention.

A film-forming chamber of a film-forming apparatus for carrying out the present invention will be described with reference to FIG. 1. First, FIG. 1A shows a film-forming process using a vapor-deposition material. In a film-forming chamber 101, a substrate 103 is disposed by a substrate holder 102. The substrate 103 intends to include a state in which a thin film is provided on a substrate surface. That is, a substrate in the process of forming a device is also included.

Further, a vapor-deposition mask 104 is provided in the vicinity of the substrate 103, and the vapor-deposition mask 104 is supported by a mask holder 105. Further, an adhesion preventing shield 106 is provided on an inner side of an inner wall of the film-forming chamber 101 so that a vapor-deposition material will not adhere to the inner wall of the film-forming chamber 101.

In this state, vapor-deposition sources 108 provided at a vapor-deposition source holder 107 are moved in a direction indicated by an arrow in the figure, whereby a vapor-deposition material 109 sublimated from the vapor-deposition sources 108 is formed into a film on the substrate 103. A vapor-deposition shield 110 is a shield for covering the vapor-deposition sources 108 until sublimation from the vapor-deposition sources 108 is stabilized.

Further, although not shown, the vapor-deposition source holder 107 is a holder in a rectangular shape that extends in a direction vertical to the drawing surface. On the vapor-deposition source holder 107, a plurality of vapor-deposition sources 108 are arranged.

Herein, the substrate holder 102, the vapor-deposition mask 104, the mask holder 105, the adhesion preventing shield 106, and the vapor deposition shield 110 are disposed in the film-forming chamber, and they are equipments to which the vapor-deposition material 109 adheres. According to the present invention, in order to heat the vapor-deposition material adhering to these equipments, it is preferable to use a material with high heat resistance as a material for the equipments.

More specifically, metal with a high melting point such as tungsten, tantalum, titanium, chromium, nickel, and molybdenum, or an alloy containing these elements may be used. Further, metal such as stainless steel, Inconel, and Hastelloy may also be used. Further, a chromium oxide film or a tantalum oxide film may be provided on the surface of these metals as a protective film.

Note that, in the case where gas is flowed in the film-forming chamber when the vapor-deposition material is re-sublimated, it is required to use metal with corrosion resistance to the gas.

Figure 1B:
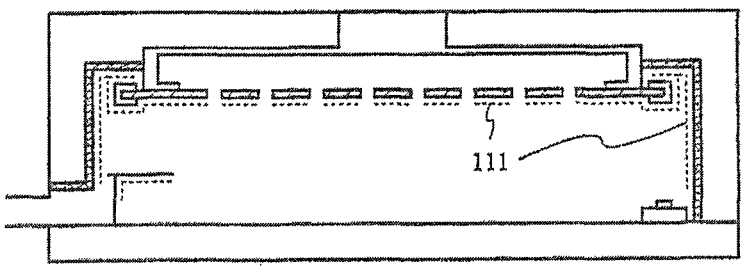

Next, FIG. 1B shows a state of the film-forming chamber 101 after the film-forming process shown in FIG. 1A is repeated a plurality of times. FIG. 1B shows a state after the substrate 103 is taken out of the film-forming chamber. In this state, the vapor-deposition material adheres to the substrate holder 102, the vapor-deposition mask 104, the mask holder 105, the adhesion preventing shield 106, and the vapor-deposition shield 110 by repeated vapor deposition. FIG. 1B shows an adhering vapor-deposition material 111 by a dotted line.

Figure 1C:
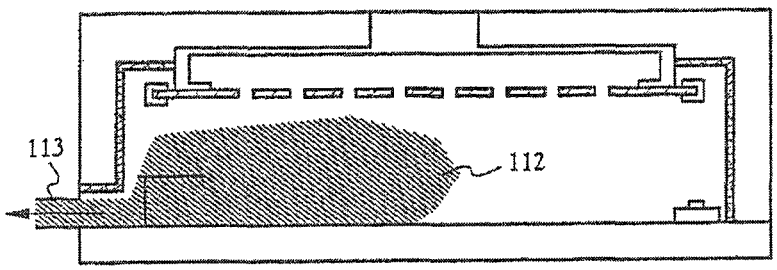

Next, FIG. 1C shows a process (cleaning process) of re-sublimation and exhaust. Herein, the vapor-deposition material 111 adhering to the substrate holder 102, the vapor-deposition mask 104, the mask holder 105, the adhesion preventing shield 106, and the vapor-deposition shield 110 is heated and re-sublimated, thereby being desorbed from the equipments again. As a heating method, heating with a heater, heating with infrared light, or heating with UV-light may be used, or a combination thereof may be used.

A vapor-deposition material 112 thus re-sublimated is immediately exhausted through an exhaust port 113 by using a vacuum pump (not shown). As a vacuum pump, any known pump may be used.

Further, gas containing a halogen-group element may be flowed in the film-forming chamber 101 when the process of re-sublimation and exhaust shown in FIG. 1C is conducted. Herein, re-sublimation is conducted while gas containing fluorine is flowed, and simultaneously, the vapor-deposition material is exhausted as fluoride.

According to a series of processes described with reference to FIGS. 1A-1C, a cleaning process is conducted after a film-forming process is conducted a plurality of times. However, a cleaning process can also be conducted for each film-forming process.

[Embodiment 1]

In this embodiment, a method of cleaning a film-forming apparatus will be described, which is characterized in that equipments provided in a film-forming apparatus are irradiated with infrared light, UV-light, or visible light to sublimate a vapor-deposition material adhering to the equipments, and the sublimated vapor-deposition material is exhausted. The present example is one example of the present invention, and can cite the above description.

Figure 2A:
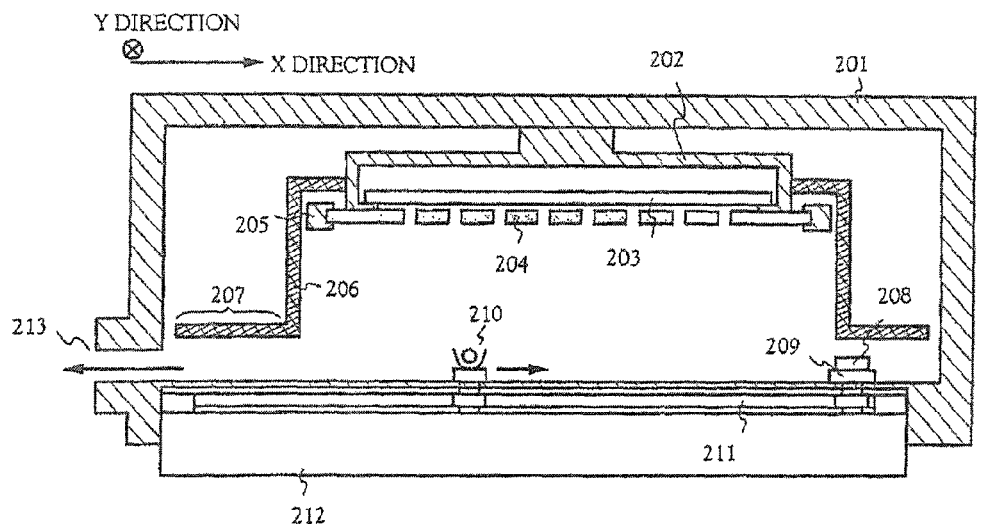
[FIGS. 2A-2B] Views showing cross-sectional structures of a film-forming chamber of Embodiment 1.
Figure 2B:
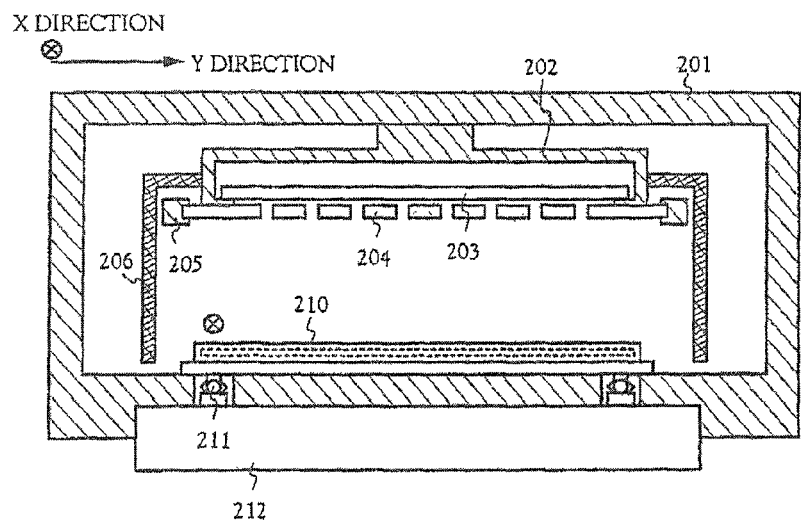
Figure 4:
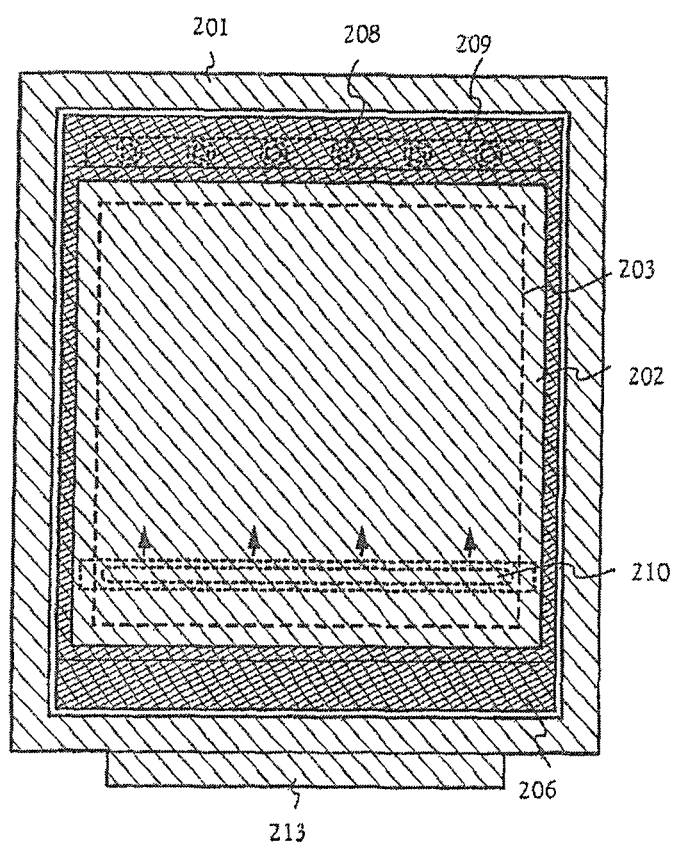
[FIG. 4] A view showing a structure of an upper surface of the film-forming chamber of Embodiment 1.

FIGS. 2A-2B show cross-sectional structures of a film-forming portion in a film-forming apparatus of this embodiment. FIGS. 2A and 2B show cross-sectional structures taken in directions vertical to each other. FIG. 2A shows a cross-section in an X-direction, and FIG. 2B shows a cross-section in a Y-direction. FIG. 4 is a top view of the film-forming portion in the film-forming apparatus of this embodiment.

In FIGS. 2A and 2B, a substrate holder 202 is provided in a film-forming chamber 201, and a substrate 203 is supported by the substrate holder 202. In this case, a substrate surface facing downward in the figure is a surface on which a thin film is to be formed.

Further, a vapor-deposition mask 204 is provided in the vicinity of the substrate 203. The vapor-deposition mask 204 is supported by a mask holder 205, and the distance between the vapor-deposition mask 204 and the substrate 203 can be adjusted by rendering the mask holder 205 variable.

Further, an adhesion preventing shield 206 is provided so as to surround the substrate 203, the vapor-deposition mask 204, and the mask holder 205. A region denoted with 207 in the adhesion preventing shield 206 can cover a vapor-deposition source until a sublimation speed of a vapor-deposition material is stabilized. More specifically, the region can have the same role as that of the vapor-deposition shield 110 shown in FIG. 1A.

Further, in a lower portion of the film-forming chamber 201, a vapor-deposition source holder 209 equipped with vapor-deposition sources 208 and a lamp light source 210 are attached to a rail 211. More specifically, the film-forming portion of this embodiment is provided with a mechanism for moving the vapor-deposition sources 208 and the lamp light source 210 along the rail 211. Further, infrared light, UV-light, or visible light are radiated by the lamp light source 210.

Figure 3A:
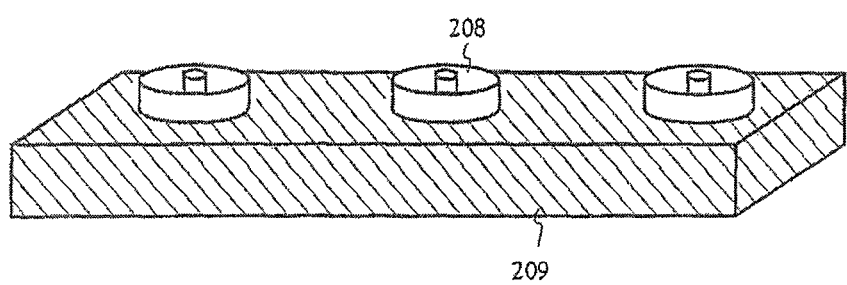
[FIGS. 3A-3B] Views showing structures of a vapor-deposition source and a vapor-deposition source holder of Embodiment 1.
Figure 3B:
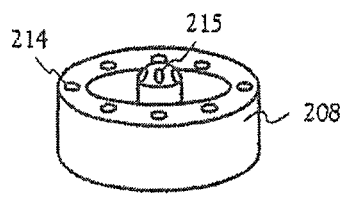

Herein, FIG. 3A shows structures of the vapor-deposition source 208 and the vapor-deposition source holder 209. As shown in FIG. 3A, the film-forming portion of this embodiment has a structure in which a plurality of vapor-deposition sources 208 are arranged on the vapor-deposition source holder 209 in an elongated rectangular shape. The number of vapor-deposition sources .208 is not limited, and the arrangement interval thereof may also be appropriately determined FIG. 3B shows a structure of the vapor-deposition source 208. The vapor-deposition source 208 shown in FIG. 3B is used for forming an organic EL material into a film, and provided with nozzles 214 for a host material for vapor-depositing a host material and nozzles 215 for a guest material for vapor-depositing a guest material.

At this time, the movement speed of the vapor-deposition sources 208 and the sublimation speed of the vapor-deposition material are controlled by a control unit 212. Similarly, the movement speed and illumination of the lamp light source 210 are also controlled by the control unit 212. Further, the movement speed and sublimation speed of the vapor-deposition sources 208 should be controlled by giving feedback on the results of monitoring a film thickness of the vapor-deposition material formed on the substrate 203 with a film thickness meter. Further, this control can also be conducted individually for each vapor-deposition source. In this case, by partitioning the substrate 203 in a matrix, setting a plurality of crystal oscillators so that they correspond to the respective partitions, and controlling the vapor-deposition speed of each vapor-deposition source, the uniformity of a film thickness can be enhanced.

Further, as the lamp light source 210, a lamp emitting infrared light (infrared light lamp), a lamp emitting UV-light (UV-light lamp), or a lamp emitting visible light (typically, a halogen lamp) is used. Further, the shape of the lamp light source 210 is a rectangle or an oblong, so that it can irradiate a large area at once by irradiation during movement. More specifically, an irradiated surface (surface of a equipment to which light is radiated) of infrared light, UV-light, or visible light emitted from the lamp light source 210 becomes a rectangle or an oblong.

According to the present invention, after the substrate 203 is taken out of the film-forming chamber 201, the vapor-deposition material adhering to the vapor-deposition mask 204, the mask holder 2.05, and the adhesion preventing shield 206 is irradiated with infrared light, UV-light, or visible light emitted from the lamp light source 210. Then, the vapor-deposition material is re-sublimated by light irradiation, and exhausted through an exhaust port 213 by using a vacuum pump (not shown). Although depending upon the temperature for sublimating the vapor-deposition material, it is preferable to use infrared light that is likely to generate heat by absorption.

It is also effective to form a thin film (light-absorbing film) that is likely to absorb infrared light, UV-light, or visible light on an inner side of the adhesion preventing shield 206 and the surface of the mask holder 205. More specifically, infrared light, UV-light, or visible light is once allowed to be absorbed by the light-absorbing film, and the adhering vapor-deposition material may be re-sublimated by heat conduction from the light-absorbing film.

The film-forming apparatus of this embodiment enables cleaning in the film-forming chamber by very simple means; more specifically, the apparatus includes means (specifically, a lamp light source) for irradiating infrared light, UV-light, or visible light to equipments provided in the film-forming chamber, and uses the means to re-sublimate a vapor-deposition material adhering to the equipments or a vapor-deposition mask so as to exhaust (remove) the material. Further, the film-forming apparatus of this embodiment has conspicuous features that cleaning in the film-forming chamber can be conducted without exposing the inside of the chamber to the atmosphere. Therefore, the conventional problem of adsorbed water or oxygen can be avoided.

Further, as shown in this embodiment, by prescribing a lamp light source in a rectangular or oblong shape, a large area can be irradiated by scanning (movement) at once. Thus, a time required for a cleaning process can be shortened, which enhances throughput.

[Embodiment 2]

In this embodiment, a method of cleaning a film-forming apparatus will be described, which is characterized in that equipments provided in a film-forming chamber are heated with radiation heat to sublimate a vapor-deposition material adhering to the equipments, and the sublimated vapor-deposition material is exhausted. Radiation heat may be generated by flowing a current through a metal line (typically, a nichrome line) with high electrical resistance. Further, this embodiment is one example of the present invention, and can cite the above description.

Figure 5A:
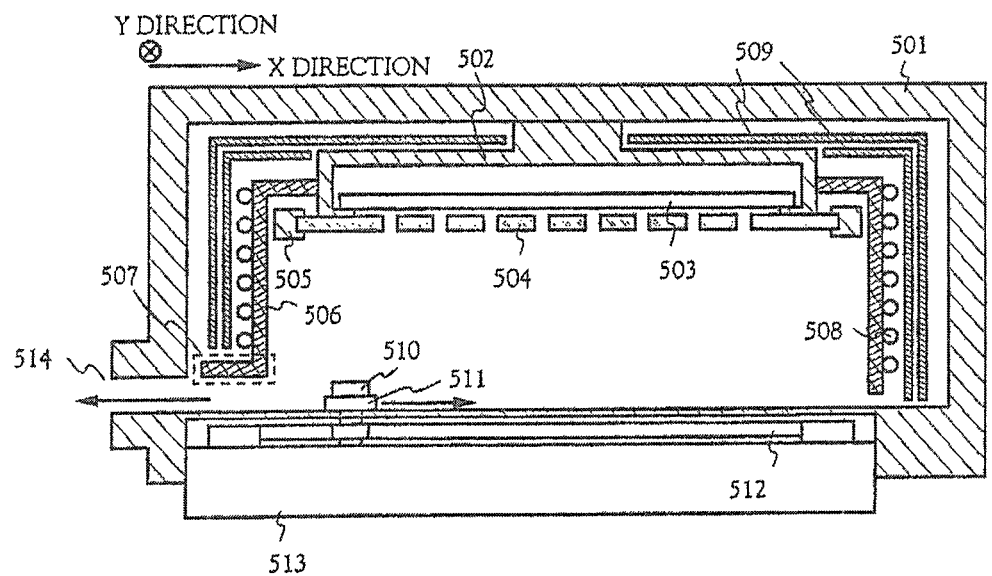
[FIGS. 5A-5B] Views showing cross-sectional structures of a film-forming chamber of Embodiment 2.
Figure 5B:
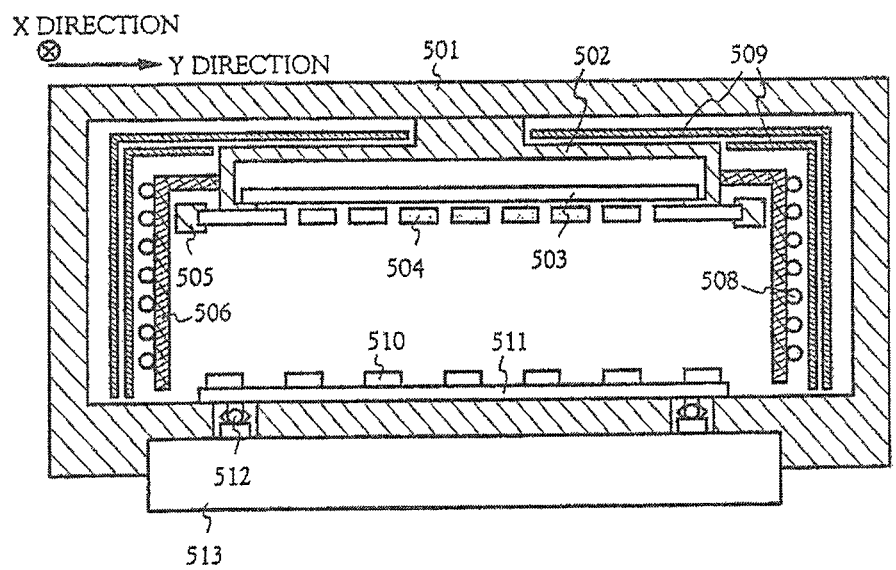
Figure 6:
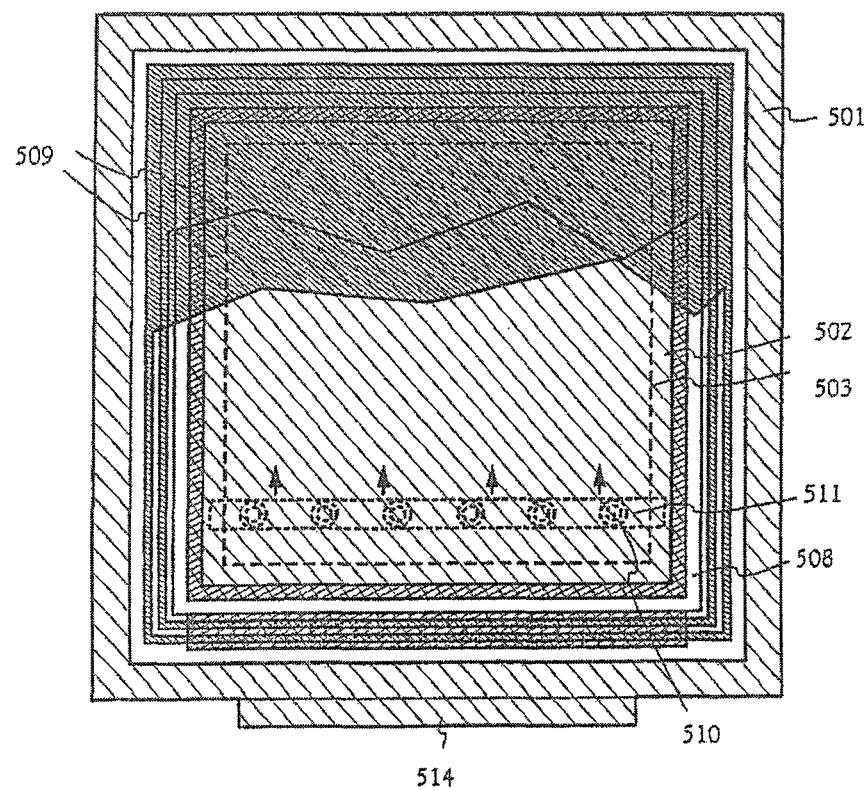
[FIG. 6] A view showing a structure of an upper surface of the film-forming chamber of Embodiment 2.

FIGS. 5A-5B show cross-sectional structures of a film-forming portion in a film-forming apparatus of this embodiment. FIGS. 5A and 5B show cross-sectional structures taken in directions vertical to each other. FIG. 5A shows a cross-section in an X-direction, and FIG. 5B shows a cross-section in a Y-direction. Further, FIG. 6 is a top view of the film-forming portion in the film-forming apparatus of this embodiment.

In FIGS. 5A and 5B, a substrate holder 502 is provided in a film-forming chamber 501, and a substrate 503 is supported by the substrate holder 502. In this case, a substrate surface facing downward in the figure is a surface on which a thin film is to be formed.

Further, a vapor-deposition mask 504 is provided in the vicinity of the substrate 503. The vapor-deposition mask 504 is supported by a mask holder 505, and the distance between the vapor-deposition mask 504 and the substrate 503 can be adjusted by rendering the mask holder 505 variable.

Further, an adhesion preventing shield 506 is provided so as to surround the substrate 503, the vapor-deposition mask 504, and the mask holder 505. A region denoted with 507 in the adhesion preventing shield 506 can cover vapor-deposition sources until a sublimation speed of a vapor-deposition material is stabilized. More specifically, the region can have the same role as that of the vapor-deposition shield 110 shown in FIG. 1A.

Further, on the periphery of the adhesion preventing shield 506, heating wires (in this embodiment, nichrome lines) 508 are provided in contact therewith. In this embodiment, by flowing a current through the heating wires 508, the entire adhesion preventing shield 506 can be heated.

Further, a reflective plate 509 is provided so as to cover the adhesion preventing shield 506. The reflective plate 509 may be one or provided in a plurality of number. The reflective plate 509 is provided for the purpose of reflecting radiation heat from the adhesion preventing shield 506 and the heating wires 508 to efficiently heat the adhesion preventing shield 508. Further, it is also effective to minimize heating of the inner wall of the film-forming chamber 501. As a material for the reflective plate 509, it is preferable to use metal with a high reflectivity. Further, in the case of flowing gas in the film-forming chamber 501, it is required to use metal with corrosion resistance to the gas.

Further, in a lower portion of the film-forming chamber 501, a vapor-deposition source holder 511 equipped with vapor-deposition sources 510 is attached to a rail 512. More specifically, the film-forming portion of this embodiment is provided with a mechanism for moving the vapor-deposition sources 510 along the rail 512. The structures of the vapor-deposition sources 510 and the vapor-deposition source holder 511 are as shown in FIGS. 3A-3B.

Further, the movement speed of the vapor-deposition sources 510 and the sublimation speed of the vapor-deposition material are controlled by a control unit 513. In this embodiment, the movement speed and sublimation speed of the vapor-deposition sources 510 are controlled by giving feedback on the results of monitoring a film thickness of the vapor-deposition material formed on the substrate 503 with a film thickness meter. Further, this control is conducted individually for each vapor-deposition source. In this case, by partitioning the substrate 503 in a matrix, setting a plurality of crystal oscillators so that they correspond to the respective partitions, and controlling the vapor-deposition speed of each vapor-deposition source, the uniformity of a film thickness can be enhanced.

According to the present invention, by flowing a current through the heating wires 507 after the substrate 503 is taken out of the film-forming chamber 501, the adhesion preventing shield 506 is heated, and the adhesion material adhering to the adhesion preventing shield 506 is re-sublimated. Then, the vapor-deposition material is exhausted through an exhaust port 514 by using a vacuum pump (not shown). Although depending upon the temperature for sublimating the vapor-deposition material, an organic material would be sufficiently sublimated even at a temperature of 500° C. or lower.

The film-forming apparatus of this embodiment enables cleaning in the film-forming chamber by very simple means; more specifically, a equipment provided in the film-forming chamber is equipped with conductors (heating wires, specifically, nichrome lines) for heating the equipment with radiation heat, and a current is flowed through the conductors to re-sublimate the vapor deposition material adhering to the equipment and exhaust (remove) it. Further, since cleaning in the film-forming chamber is possible without exposure to the atmosphere, the conventional problem of adsorbed water or oxygen can be avoided.

[Embodiment 3]

In this embodiment, a film-forming apparatus will be described in which an exhaust treatment chamber is connected to a film-forming chamber. In the film-forming apparatus of this embodiment shown in FIG. 7, a film-forming chamber 702 has the same structure as that shown in FIG. 2A, and an exhaust treatment chamber 701 is connected in series to the film-forming chamber 702. Thus, regarding the film-forming chamber 702, Embodiment 1 will be referred to, and the exhaust treatment chamber 701 will be mainly described.

Figure 7:
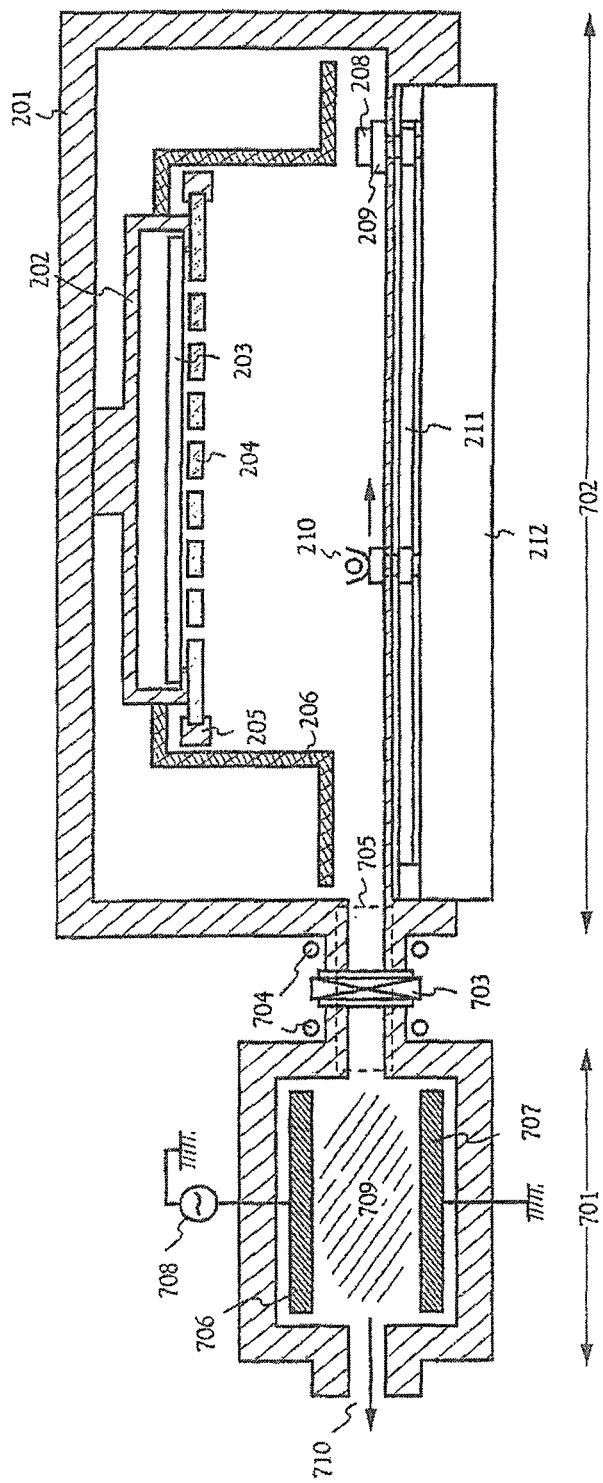
[FIG. 7] A view showing cross-sectional structures of a film-forming chamber of Embodiment 3.

In FIG. 7, the exhaust treatment chamber 701 is connected to the film-forming chamber 702 through a gate 703. The gate 703 plays a role in preventing exhaust gas from being mixed in the film-forming chamber 702 from the exhaust treatment chamber 701. Heating wires 704 are provided at a pipe in the vicinity of the gate 703, and the pipe 705 can be heated. The heating wires 704 are provided so as to prevent the vapor-deposition material exhausted from the film-forming chamber 701 from adhering to the pipe 705.

In the exhaust treatment chamber 701, an upper electrode 706 and a lower electrode 707 are provided in the exhaust treatment chamber 701, and a high-frequency power supply 708 is connected to the upper electrode 706. Further, the lower electrode 707 is grounded. Further, gas for forming plasma can be supplied to the inside of the exhaust treatment chamber 701, and by applying a voltage between the upper electrode 706 and the lower electrode 707, plasma 709 can be formed.

The vapor-deposition material exhausted from the film-forming chamber 702 is exposed to the plasma 709 in the exhaust treatment chamber 701, and changed to inactive gas by decomposition or bonding to be exhausted from an exhaust port 710. More specifically, the re-sublimated vapor-deposition material is exposed to plasma during the exhaust and changed to inactive gas; therefore, there will not be a problem that the vapor-deposition material adheres onto the pipe after the exhaust port 710.

If the vapor-deposition material is an organic material (including an organic EL material), it is preferable to use oxygen as gas for forming plasma and to process the vapor-deposition material with oxygen plasma. However, care should be taken so that oxygen remaining in the exhaust treatment chamber 701 will not flow in a reverse direction to the film-forming chamber 702.

Note that the structure of this embodiment may be combined with either of Embodiment 1 or 2.

[Embodiment 4]

In this embodiment, the case will be described in which gas containing a halogen-group element is flowed in a film-forming chamber when a vapor-deposition material adhering to equipments is re-sublimated in a film-forming apparatus with the structure of either of Embodiments 1 to 3.

Typical examples of the halogen-group element include fluorine, chlorine, bromine, and iodine. Typical examples of the gas containing these halogen-group elements include fluorine ($F_2$) gas, chlorine ($Cl_2$) gas, and carbon tetrafluoride ($CF_4$) gas.

In this embodiment, a re-sublimated vapor-deposition material is reacted with the above-mentioned gas containing a halogen-group element to be changed to inactive gas, whereby the vapor-deposition material is prevented from adhering to the equipments, pipes, and inner walls of the film-forming chamber again.

The structure of this embodiment can be combined with either of Embodiments 1 to 3.

[Embodiment 5]

Figure 8:
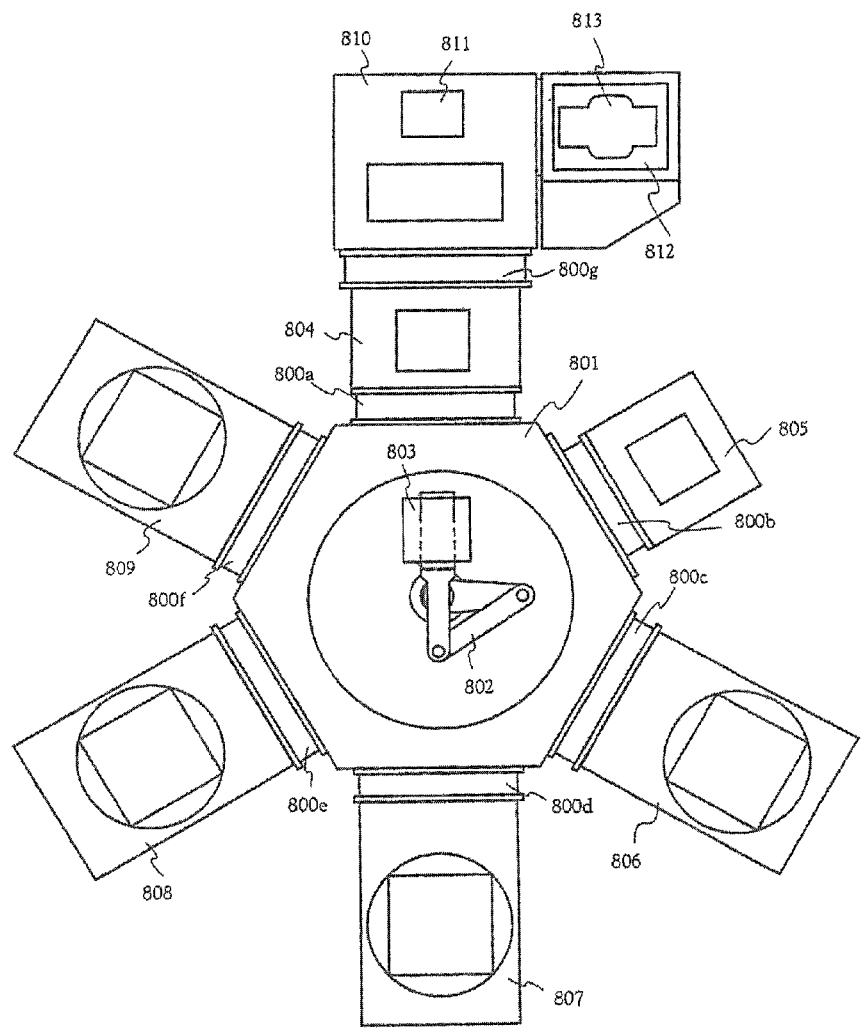
[FIG. 8] A view showing a structure of a film-forming apparatus of a multi-chamber system of Embodiment 5.

In this embodiment, a film-forming apparatus will be described in which a plurality of film-forming chambers with the structure of either of Embodiments 1 to 4 are provided by a multi-chamber system (also called a cluster tool system). FIG. 8 shows a schematic view of a film-forming apparatus of this embodiment. In this embodiment, a film-forming apparatus for forming an EL element is shown.

In FIG. 8, reference numeral 801 denotes a transport chamber, and the transport chamber 801 is provided with a transport mechanism (A) 802 for transporting a substrate 803. The transport chamber 801 is exposed to the reduced-pressure atmosphere, and is connected to each treatment chamber via a gate. The substrate is transferred to each treatment chamber by the transport mechanism (A) 802 when the gate is opened. Further, in order to reduce the pressure in the transport chamber 801, an exhaust pump such as an oil rotary pump, a mechanical boster pump, a turbo molecular pump, or a cryopump can be used. However, a cryopump that is effective for removing moisture is preferable.

Hereinafter, each treatment chamber will be described. Since the transport chamber 801 is exposed to the reduced-pressure atmosphere, an exhaust pump (not shown) is provided in each treatment chamber directly connected to the transport chamber 801. As the exhaust pump, the above-mentioned oil rotary pump, mechanical boster pump, turbo molecular pump, or cryopump is used.

First, reference numeral 804 denotes a load chamber for setting a substrate, and is referred to as a load lock chamber. The load chamber 804 is connected to the transport chamber 801 via a gate 800*a*, in which a carrier (not shown) on which the substrate 803 is set is disposed. The load chamber 804 may be separated into a portion for input of a substrate and a portion for output of a substrate. Further, the load chamber 804 is provided with the above-mentioned exhaust pump and a purge line for introducing high-purity nitrogen gas or noble gas.

Next, reference numeral 805 denotes a pretreatment chamber for treating the surface of a positive electrode or a negative electrode (in this embodiment, a positive electrode) of an EL element, and the pretreatment chamber 805 is connected to the transport chamber 801 via a gate 800*b*. The pretreatment chamber may be changed variously depending upon the manufacturing process of EL elements. In this embodiment, the pretreatment chamber is designed in such a manner that the positive electrode can be heated at 100° C. to 120° C. while the surface of the positive electrode made of a conductive oxide film is irradiated with UV-light. Such pretreatment is effective for treating the surface of a positive. electrode of an EL element.

Next, reference numeral 806 denotes a film-forming chamber for forming an organic material and an organic EL material into films by vapor deposition, and referred to as a film-forming chamber (A). The film-forming chamber (A) 806 is connected to the transport chamber 801 via a gate 800*c*. In this embodiment, as the vapor-deposition chamber (A) 806, the film-forming portion shown in Embodiment 1 or 2 is provided. In this embodiment, in the film-forming chamber (A) 806, an organic material to be a hole injection layer and an organic EL material to be a light-emitting layer that develops red color are formed into films. Thus, a vapor-deposition source and a vapor-deposition mask are provided in two kinds so that switching can be made.

Next, reference numeral 807 denotes a film-forming chamber for forming an organic EL material into a film by vapor deposition, and is referred to as a film-forming chamber (B). The film-forming chamber (B) 807 is connected to the transport chamber 801 via a gate 800*d*. In this embodiment, as the film-forming chamber (B) 807, the film-forming chamber shown in Embodiment 1 or 2 is provided. In this embodiment, in the film-forming chamber (B) 807, an organic EL material to be a light-emitting layer that develops green color is formed into a film.

Next, reference numeral 808 denotes a film-forming camber for forming an organic EL material into a film by vapor deposition, and is referred to as a film-forming chamber (C). The film-forming chamber (C) 808 is connected to the transport chamber 801 via a gate 800*e*. In this embodiment, the film-forming chamber shown in Embodiment 1 or 2 is provided as the film-forming chamber (C) 808. In this embodiment, in the film-forming chamber (C) 808, an organic EL material to be a light-emitting layer that develops blue color is formed into a film.

Next, reference numeral 809 denotes a film-forming chamber for forming a conductive film to be a positive electrode or a negative electrode (in this embodiment, a metal film to be a negative electrode) of a EL element by vapor deposition, and is referred to as a film-forming chamber (D). The film-forming chamber (D) 809 is connected to the transport chamber 801 via a gate 800*f*. In this embodiment, as the film-forming chamber (D) 809, the film-forming chamber shown in Embodiment 1 or 2 is provided. In this embodiment, in the film-forming chamber (D) 809, an Al—Li alloy film (alloy film of aluminum and lithium) is formed as a conductive film to be a negative electrode of an EL element. An element belonging to Group I or Group II of the periodic table and aluminum can be vapor-deposited together.

Next, reference numeral 810 denotes a sealing chamber that is connected to the load chamber 804 via a gate 800*g*. The sealing chamber 810 is provided with a UV-lamp 811. Further, the sealing chamber 810 is connected to a transfer chamber 812. The transfer chamber 812 is provided with a transfer mechanism (B) 813 that transports a substrate which is completed for sealing of an EL element in the sealing chamber 810 to the transfer chamber 812.

At this time, in the sealing chamber 810, the step of sealing (enclosing) a formed EL element into a sealed space is conducted. More specifically, a sealant is attached to an EL element with UV-curable resin so as to cover it, and the UV-curable resin is cured with UV-light emitted from a UV-light lamp 811 to seal the EL element.

As described above, by using the film-forming apparatus shown in FIG. 8, an EL element is not exposed to the outside air until it is sealed in a sealed space completely. Therefore, a light-emitting device with high reliability can be manufactured.

Further, by using the film-forming chamber of the present invention as the film-forming chamber (A) 806, the film-forming chamber (B) 807, the film-forming chamber (C) 808, and the film-forming chamber (D) 809, each film-forming chamber can be cleaned without being exposed to the atmosphere. Thus, a light emitting device with higher reliability can be manufactured.

[Embodiment 6]

Figure 9:
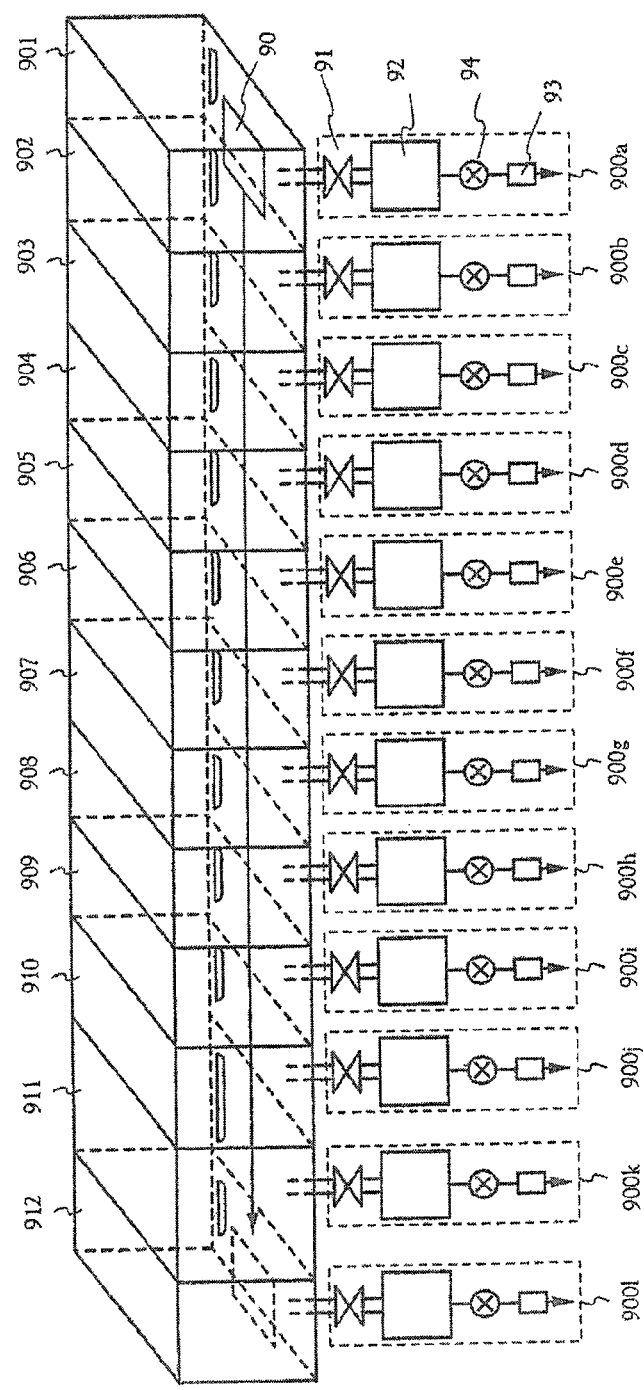
[FIG. 9] A view showing a structure of a film-forming apparatus of an in-line system of Embodiment 6.

In this embodiment, a film-forming apparatus will be described in which a plurality of film forming chambers with the structure of either of Embodiments 1 to 4 are provided in an in-line system. FIG. 9 shows a schematic view of a film-forming apparatus of this embodiment. In this embodiment, a film-forming apparatus for forming an EL element will be shown.

In FIG. 9, reference numeral 901 denotes a load chamber, from which a substrate 90 is transported. The load chamber 901 is provided with an exhaust system 900*a*. The exhaust system 900*a* includes a first valve 91, a turbo molecular pump 92, a second valve 93, and a rotary pump (oil rotary pump) 94.

The first valve 91 is a main valve, which may also function as a conductance valve or use a butterfly valve. The second valve 93 is a fore valve. First, the second valve 93 is opened, and the pressure in the load chamber 901 is roughly reduced by the rotary pump 94. Then, the first valve 91 is opened, and the pressure of the load chamber 901 is reduced to high vacuum by the turbo molecular pump 92. A mechanical buster pump or a cryopump can be used in place of the turbo molecular pump. The cryopump is particularly effective for removing moisture.

Next, reference numeral 902 denotes a pretreatment chamber for treating the surface of a positive electrode or a negative electrode (in this embodiment, a positive electrode) of an EL element, and the pretreatment chamber 902 is provided with an exhaust system 900b. Further, the pretreatment chamber 902 is sealed by a gate (not shown) so as to be isolated from the load chamber 901. The pretreatment chamber 902 can be changed variously depending upon the manufacturing process of an EL element.

As the pretreatment, ozone plasma treatment, oxygen plasma treatment, argon plasma treatment, neon plasma treatment, helium plasma treatment, or hydrogen plasma treatment can be conducted. Further, by providing a heater, heating can be conducted simultaneously with plasma treatment. Further, it is also effective to enable UV-light irradiation to be conducted by providing a UV-light lamp.

In this embodiment, the surface of a positive electrode made of a conductive oxide film is subjected to ozone plasma treatment while the substrate is being heated at 100° C., whereby pretreatment for enhancing a work function of the surface of the positive electrode is conducted while moisture is being removed.

Next, reference numeral 903 denotes a film-forming chamber for forming an organic material into a film by vapor deposition, and referred to as a film-forming chamber (A). The film-forming chamber (A) 903 is provided with an exhaust system 900c. The film-forming chamber (A) 903 is sealed by a gate (not shown) so as to be isolated from the pretreatment chamber 902. In this embodiment, the film-forming chamber shown in Embodiment 1 or 2 is used as the film-forming chamber (A) 903, and a hole injection layer is formed in the film-forming chamber (A) 903.

Next, reference numeral 904 refers to a film-forming chamber for forming an organic material into a film by vapor deposition, and is referred to as a film-forming chamber (B). The film-forming chamber (B) 904 is provided with an exhaust system 900d. Further, the film-forming chamber (B) 904 is sealed by a gate (not shown) so as to be isolated from the film-forming chamber (A) 903. In this embodiment, as the film-forming chamber (B) 904, the film-forming chamber shown in Embodiment 1 or 2 is used, and a hole transport layer is formed in the film-forming chamber (B) 904.

Next, reference numeral 905 refers to a film-forming chamber for forming an organic EL material into a film by vapor deposition, and is referred to as a film-forming chamber (C). The film-forming chamber (C) 905 is provided with an exhaust system 900e. Further, the film-forming chamber (C) 905 is sealed by a gate (not shown) so as to be isolated from the film-forming chamber (B) 904. In this embodiment, as the film-forming chamber (C) 905, the film-forming chamber shown in Embodiment 1 or 2 is used, and a light-emitting layer that develops red color is formed in the film-forming chamber (C) 905.

Next, reference numeral 906 refers to a film-forming chamber for forming an organic EL material into a film by vapor deposition, and is referred to as a film-forming chamber (D). The film-forming chamber (D) 906 is provided with an exhaust system 900f. Further, the film-forming chamber (D) 906 is sealed by a gate (not shown) so as to be isolated from the film-forming chamber (C) 905. In this embodiment, as the film-forming chamber (D) 906, the film-forming chamber shown in Embodiment 1 or 2 is used, and a light-emitting layer that develops green color is formed in the film-forming chamber (D) 906.

Next, reference numeral 907 refers to a film-forming chamber for forming an organic EL material into a film by vapor deposition, and is referred to as a film-forming chamber (E). The film-forming chamber (E) 907 is provided with an exhaust system 900g. Further, the film-forming chamber (E) 907 is sealed by a gate (not shown) so as to be isolated from the film-forming chamber (ID) 906. In this embodiment, as the film-forming chamber (E) 907, the film-forming chamber shown in Embodiment 1 or 2 is used, and a light-emitting layer that develops blue color is formed in the film-forming chamber (E) 907.

Next, reference numeral 908 refers to a film-forming chamber for forming an organic material into a film by vapor deposition, and is referred to as a film-forming chamber (F). The film-forming chamber (F) 908 is provided with an exhaust system 900h. Further, the film-forming chamber (F) 908 is sealed by a gate (not shown) so as to be isolated from the film-forming chamber (E) 907. In this embodiment, as the film-forming chamber (F) 908, the film-forming chamber shown in Embodiment 1 or 2 is used, and an electron transport layer is formed in the film-forming chamber (F) 908.

Next, reference numeral 909 refers to a film-forming chamber for forming an organic material into a film by vapor deposition, and is referred to as a film-forming chamber (G). The film-forming chamber (G) 909 is provided with an exhaust system 900i. Further, the film-forming chamber (G) 909 is sealed by a gate (not shown) so as to be isolated from the film-forming chamber (F) 908. In this embodiment, as the film-forming chamber (G) 909, the film-forming chamber shown in Embodiment 1 or 2 is used, and an electron injection layer is formed in the film-forming chamber (G) 909.

Next, reference numeral 910 refers to a film-forming chamber for forming a conductive film to be a positive electrode or a negative electrode (in this embodiment, a metal film to be a negative electrode) of an EL element by vapor deposition, and is referred to as a film-forming chamber (H). The film-forming chamber (H) 910 is provided with an exhaust system 900j. Further, the film-forming chamber (H) 910 is sealed by a gate (not shown) so as to be isolated from the film-forming chamber (G) 909. In this embodiment, as the film-forming chamber (H) 910, the film-forming chamber shown in Embodiment 1 or 2 is used.

Further, in this embodiment, in the film-forming chamber (H) 910, an Al—Li alloy film (alloy film of aluminum and lithium) or an Al—Cs alloy film (alloy film of aluminum and cesium) is formed as a conductive film to be a negative electrode of an EL element. An element belonging to Group I or Group II of the periodic table and aluminum can be vapor-deposited together.

Next, reference numeral 911 denotes a sealing chamber, which is provided with an exhaust system 900k. Further, the sealing chamber 911 is sealed by a gate (not shown) so as to be isolated from the film-forming chamber (H) 910. In the sealing chamber 911, in order to protect an EL element from oxygen and moisture, a carbon film, more specifically, a DLC (diamond-like carbon) film is formed as a passivation film.

In order to form the DLC film, sputtering, plasma CVD, or ion plating may be used. In the case of using ion plating, the film-forming apparatus with the structure of Embodiment 1 may be used. In the case of ion plating, unlike ordinary vapor deposition, an electrode for applying an electric field thereto is required. However, a vapor-deposition material adhering to the electrode may be re-sublimated by light irradiation from a lamp light source and exhausted.

The DLC film can be formed in a temperature range from room temperature to 100° C., so that the DLC film is preferable as a passivation film for protecting an EL element with low heat resistance. Further, the DLC film has high heat conductivity and a good heat radiation effect; therefore, the effect of suppressing thermal degradation of an EL element can also be expected. It is also effective that the DLC film formed in this embodiment is used by being stacked with a silicon nitride film or a silicon carbide film.

Finally, reference numeral 912 denotes an unload chamber, which is provided with an exhaust system 900*l*. A substrate with an EL element formed thereon is taken out from the unload chamber 912.

It is effective to operate each treatment chamber, exhaust system, and transport system in the film-forming apparatus shown in this embodiment by computer control. In the case of this embodiment, since an EL element is completed by continuously conducting a series of treatments, the input of a substrate to the output thereof can be managed by computer control.

As described above, by using the film-forming apparatus shown in FIG. 9, an EL element is not required to be exposed to the outer atmosphere until it is completely sealed in a sealed space. Therefore, an EL display apparatus with high reliability can be manufactured. Further, due to the in-line system, an EL display apparatus with high throughput can be manufactured.

Further, by using the film-forming chamber of the present invention as the film-forming chamber (A) 903, the film-forming chamber (B) 904; the film-forming chamber (C) 905, the film-forming chamber (D) 906, the film-forming chamber (E) 907, the film-forming chamber (F) 908, the film-forming chamber (G) 909, and the film-forming chamber (H) 910, each film-forming chamber can be cleaned without being exposed to the atmosphere. Thus, a light-emitting device with high reliability can be manufactured.

[Embodiment 7]

In this embodiment, a method of manufacturing an electro-optical device (in this embodiment, a light-emitting device including an EL element) including the cleaning method with the structure of either of Embodiments 1 to 4 will be described.

Figure 10A:
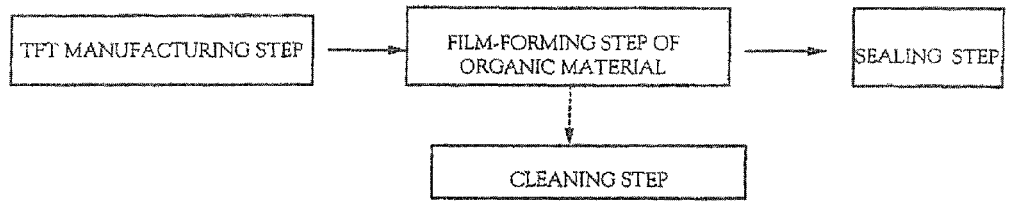
[FIGS. 10A-10B] Flow charts showing the steps of manufacturing a light-emitting device of Embodiment 7.
Figure 10B:
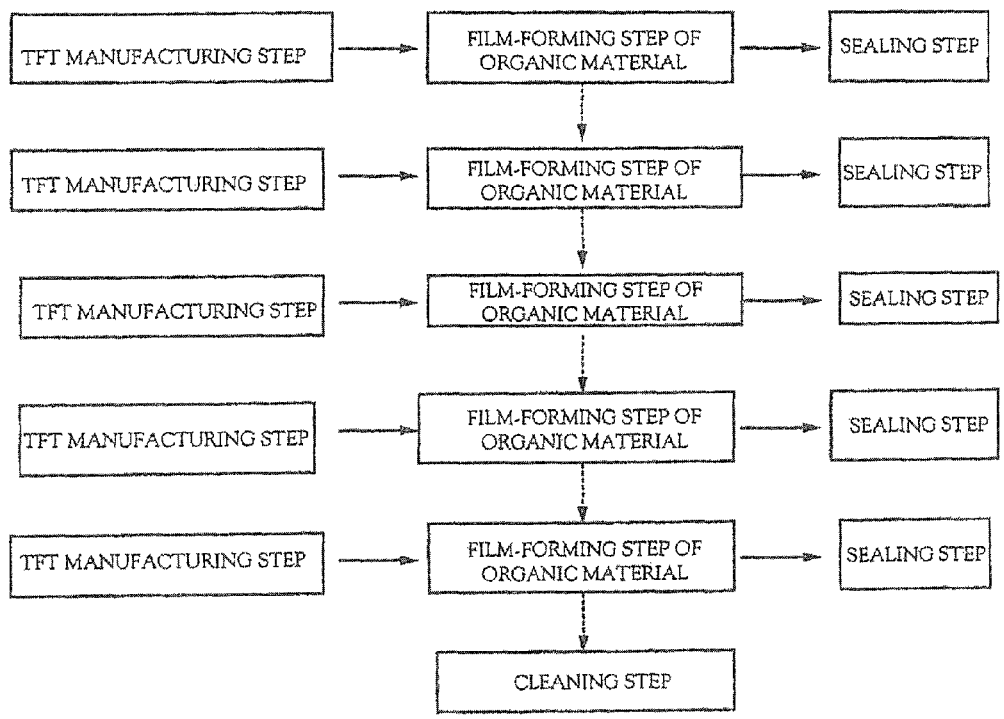

Each flowchart in FIGS. 10A-10B shows a flow of the steps of manufacturing a light-emitting device in this embodiment. First, FIG. 10A shows an example in which a film-forming apparatus is cleaned by the method of either of Embodiments 1 to 4 every time an organic material (also containing an organic EL material) for forming an EL element is formed into a film. In this case, the film-forming apparatus of Embodiment 5 or 6 may be used.

In this case, after the step of manufacturing a TFT on an insulator (TFT manufacturing step), the step of forming an organic material for forming an EL element into a film (film-forming step of an organic material) is conducted, and the step of sealing an EL element (sealing step) is conducted, whereby a light-emitting device is completed. In these series of manufacturing steps, immediately after the film-forming step of an organic material is completed, the step of cleaning the film-forming apparatus is conducted, and thereafter, the subsequent film-forming step of an organic material is conducted.

A method of manufacturing an active matrix type light-emitting device includes the step of manufacturing a TFT. However, a method of manufacturing a passive matrix type light-emitting device or a light source including an EL element does not include the step of manufacturing a TFT. In this respect, the step of manufacturing a TFT is represented by using parentheses.

Next, FIG. 10B shows an example in which a film-forming apparatus is cleaned by the method of either of Embodiments 1 to 4 after the film-forming step of an organic material (also including an organic EL material) for forming an EL element is conducted a plurality of times. More specifically, when the film thickness of a vapor-deposition material adhering to equipments provided in a film-forming chamber reaches a film thickness to some degree, the cleaning step is periodically conducted.

In this case, in the steps of manufacturing a light-emitting device continuously conducted, after the film-forming step of an organic material is conducted with respect to a plurality of substrates, the step of cleaning the film-forming apparatus is conducted, and thereafter, the subsequent film-forming step of an organic material is conducted.

[Embodiment 8]

In this embodiment, exemplary steps of manufacturing a passive matrix type light-emitting device including an EL element will be described.

Figure 11A:
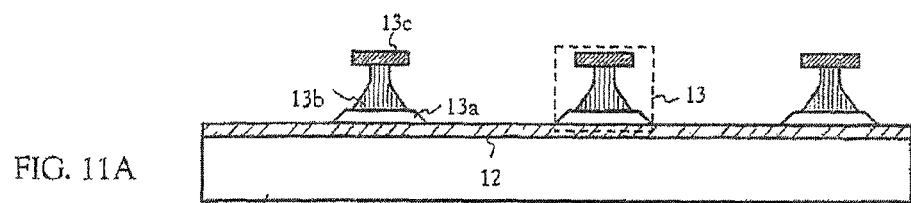
[FIGS. 11A-11B] Views showing the steps of manufacturing a light-emitting device of Embodiment 8.
Figure 11B:
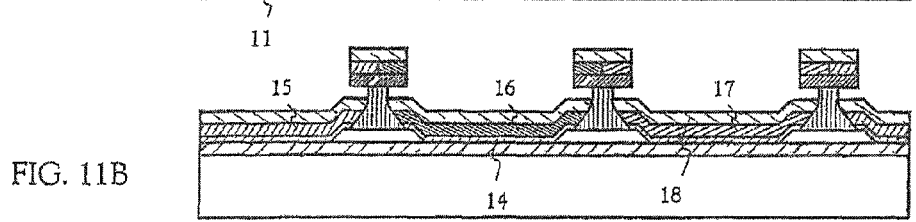

First, as shown in FIG. 11A, a positive electrode 12 made of a conductive oxide film is formed on a substrate 11 with an insulating film formed on a surface thereof, and partition walls 13 are formed on the positive electrode 12. The partition wall 13 is composed of a first partition wall portion 13*a* made of a silicon oxide film, a second partition wall portion 13*b* made of a resin film, and a third partition wall portion 13*c* made of a silicon nitride film.

At this time, the first partition wall portion 13*a* may be patterned by photolithography. Further, the shapes of the second partition wall portion 13*b* and the third partition wall portion 13*c* are obtained by etching a resin film to be the second partition wall portion 13*b* and a resin film to be the third partition wall portion 13*c* to the same shape, and thereafter, etching the resin film to be the second partition wall portion 13*b* in an isotropic manner, using the third partition wall portion 13*c* as a mask.

Next, the step of forming an organic material for forming an EL element into a film by using the film-forming apparatus shown in Embodiment 5 is conducted. First, surface treatment of the positive electrode 12 is conducted in the pretreatment chamber 805, and a hole injection layer 14 and a light-emitting layer (R) 15 are formed in the film-forming chamber (A) 806. The light-emitting layer (R) is a light-emitting layer that emits red light.

Next, a light-emitting layer (G) 16 is formed in the film-forming chamber (B) 807, and a light-emitting layer (B) 17 is formed in the film-forming chamber (C) 808. The light-emitting layer (G) is a light-emitting layer that emits green light, and the light-emitting layer (B) is a light-emitting layer that emits blue light.

Next, an Al—Li alloy film obtained by vapor-depositing aluminum (Al) and lithium (Li) together is formed as a negative electrode 18. Then, a sealing step is conducted in the sealing chamber 810, whereby a passive matrix type light-emitting device is completed.

At this time, after the hole injection layer 14, the light-emitting layer (R) 15, the light-emitting layer (G) 16, the light-emitting layer (B) 17, or the negative electrode 18 is formed, cleaning of each film-forming chamber may be conducted by using the structure shown in either of Embodiments 1 to 4. It is appreciated that cleaning may be conducted for each film formation as shown in FIGS. 10A-10B, or cleaning may be conducted after the film-forming step is conducted a plurality of times.

Further, in this embodiment, the film-forming apparatus shown in Embodiment 5 is used. However, the film-forming apparatus shown in Embodiment 6 may be used.

[Embodiment 9]

In this embodiment, exemplary steps of manufacturing an active matrix type light-emitting device including an EL element will be described.

Figure 12A:
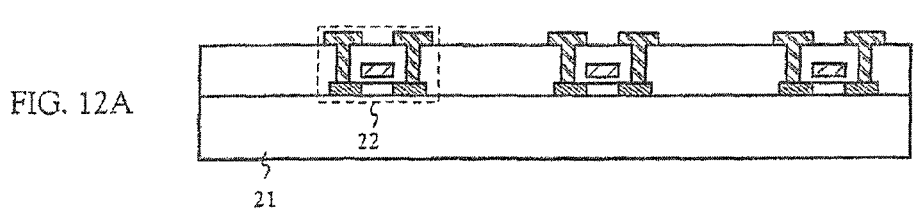
[FIGS. 12A-12C] Views showing the steps of manufacturing a light-emitting device of Embodiment 9.
Figure 12B:
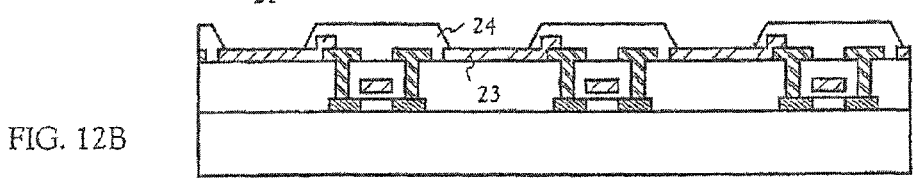
Figure 12C:
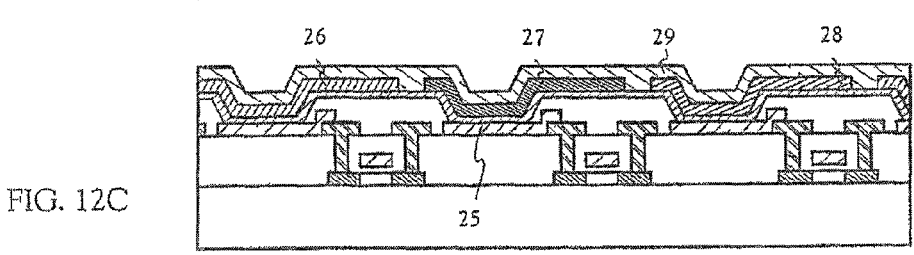

First, thin film transistors (hereinafter, referred to as "TFTs") 22 are formed on a substrate 21 with an insulating film formed on its surface by a known manufacturing step, as shown in FIG. 12A. Then, as shown in FIG. 12B, a positive electrode 23 made of a conductive oxide film and an insulating film 24 made of a silicon oxide film are formed.

Then, the step of forming an organic material for forming an EL element is conducted by using the film-forming apparatus shown in Embodiment 5. First, surface treatment of the positive electrode 23 is conducted in the pretreatment chamber 805, and a hole injection layer 25 and a light-emitting layer (R) 26 are formed in the film-forming chamber (A) 806. The light-emitting layer (R) is a light-emitting layer that emits red light.

Then, a light-emitting layer (G) 27 is formed in the film-forming chamber (B) 807, and a light-emitting layer (B) 28 is formed in the film-forming chamber (C) 808. The light-emitting layer (G) is a light-emitting layer that emits green light, and the light-emitting layer (B) is a light-emitting layer that emits blue light.

Next, an Al—Li alloy film obtained by co-vapor-depositing aluminum (Al) and lithium (Li) together is formed as a negative electrode 29. Then, a sealing step is conducted in the sealing chamber 810, whereby an active matrix type light-emitting device is completed.

At this time, after the hole injection layer 25, the light-emitting layer (R) 26, the light-emitting layer (G) 27, the light-emitting layer (B) 28, or the negative electrode 29 is formed, cleaning of each film-forming chamber may be conducted by using the structure shown in either of Embodiments 1 to 4. It is appreciated that cleaning may be conducted for each film formation as shown in FIGS. 10A-10B, or cleaning may be conducted after the film-forming step is conducted a plurality of times.

Further, in this embodiment, the film-forming apparatus shown in Embodiment 5 is used. However, the film-forming apparatus shown in Embodiment 6 may be used.

[Embodiment 10]

Figure 13A:
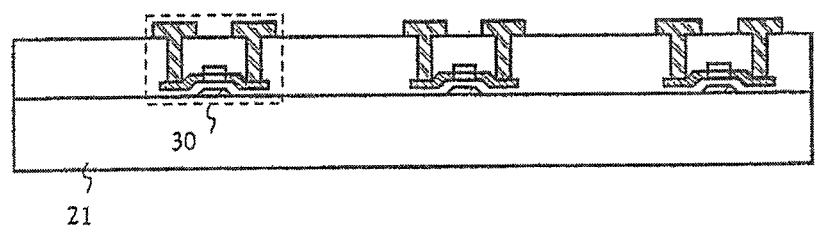
[FIGS. 13A-13C] Views showing the steps of manufacturing a light-emitting device of Embodiment 10.

In Embodiment 9, an example has been shown in which a top gate type TFT (specifically, a planar type TFT) is manufactured as the TFT 22. However, in this embodiment, as shown in FIGS. 13A-13O, a TFT 30 is used in place of the TFT 22. The TFT 30 used in this embodiment is a bottom gate type TFT (specifically, an inverted stagger type TFT) which may be formed by a known manufacturing step.

The other structure is the same as that in Embodiment 9. Therefore, the detailed description in this embodiment and the description of reference numerals will be omitted.

By carrying out the present invention, a film-forming apparatus (vapor-deposition apparatus) can be cleaned without exposing equipments provided in the apparatus or the inner wall of a film-forming chamber to the atmosphere. Therefore, a time required for cleaning the equipments or the like can be shortened, which leads to reduction of the steps of manufacturing an electro-optical device.

In particular, in the case where a light-emitting device including an EL element is manufactured by conducting the cleaning method of the present invention, degradation of an organic EL material for forming an EL element due to adsorbed oxygen or water can be reduced; therefore, a light-emitting device with good reliability can be manufactured.

What is claimed is:

1. A method of manufacturing a device, comprising the steps of:
   disposing a substrate in a film formation chamber, wherein an adhesion preventing shield is provided in the film formation chamber to surround the substrate;
   disposing a holder in the film formation chamber, the holder having a longitudinal direction, wherein a plurality of vapor-deposition sources are arranged along the longitudinal direction on the holder, and wherein each of the plurality of vapor-deposition sources has a plurality of first nozzles and a plurality of second nozzles surrounded by the plurality of first nozzles;
   forming an EL layer comprising an organic material including a host material and a guest material over the substrate by vapor-depositing the host material and the guest material by using the plurality of first nozzles and the plurality of second nozzles, respectively, wherein a relative position of the substrate with respect to the holder is changed in a direction orthogonal to the longitudinal direction during the formation of the EL layer;
   removing the substrate from the film formation chamber after the EL layer is formed;
   cleaning the adhesion preventing shield by removing the organic material deposited on the adhesion preventing shield in the film formation chamber after the substrate is removed; and
   exhausting the organic material from the film formation chamber during cleaning.

2. The method for manufacturing a device according to claim 1, wherein the organic material is removed by sublimating the organic material deposited on the adhesion preventing shield.

3. The method for manufacturing a device according to claim 1, wherein the organic material is removed by sublimating the organic material deposited on the adhesion preventing shield by heating.

4. The method according to claim 1, wherein the holder moves in the direction orthogonal to the longitudinal direction during the formation of the EL layer.

5. The method according to claim 1,
   wherein a plasma is formed in an exhaust treatment chamber during the exhausting of the sublimated organic material, and
   wherein the exhaust treatment chamber is connected with the film formation chamber.

6. The method according to claim 1,
   wherein the movement speed of the plurality of vapor-deposition sources are controlled by a control unit during the formation of the EL layer.

7. A method of manufacturing a device, comprising the steps of:
   disposing a substrate in a film formation chamber, wherein an adhesion preventing shield is provided in the film formation chamber to surround the substrate;
   disposing a holder in the film formation chamber, the holder having a longitudinal direction, wherein a plurality of vapor-deposition sources are arranged along the longitudinal direction on the holder, and wherein each of the plurality of vapor-deposition sources has a plurality of first nozzles and a plurality of second nozzles surrounded by the plurality of first nozzles;
   forming an EL layer comprising an organic material including a host material and a guest material over the substrate by vapor-depositing the host material and the guest material by using the plurality of first nozzles and the plurality of second nozzles, respectively, wherein a relative position of the substrate with respect to the holder is changed in a direction orthogonal to the longitudinal direction during the formation of the EL layer;
   removing the substrate from the film formation chamber after the EL layer is formed;

cleaning the adhesion preventing shield by removing the organic material deposited on the adhesion preventing shield in the film formation chamber after the substrate is removed; and exhausting the organic material from the film formation chamber during cleaning, wherein an edge of the substrate is parallel with the longitudinal direction of the holder.

8. The method for manufacturing a device according to claim 7, wherein the organic material is removed by sublimating the organic material deposited on the adhesion preventing shield.

9. The method for manufacturing a device according to claim 7, wherein the organic material is removed by sublimating the organic material deposited on the adhesion preventing shield by heating.

10. The method according to claim 7, wherein the holder moves in the direction orthogonal to the longitudinal direction during the formation of the EL layer.

11. The method according to claim 7, wherein a plasma is formed in an exhaust treatment chamber during the exhausting of the sublimated organic material, and wherein the exhaust treatment chamber is connected with the film formation chamber.

12. A method of manufacturing a device, comprising the steps of:

disposing a substrate in a film formation chamber, wherein an adhesion preventing shield is provided in the film formation chamber to surround the substrate;

arranging a plurality of vapor-deposition sources along one direction in the film formation chamber, and wherein each of the plurality of vapor-deposition sources has a plurality of first nozzles with and a plurality of second nozzles surrounded by the plurality of first nozzles;

forming an EL layer comprising an organic material including a host material and a guest material over the substrate by vapor-depositing the host material and the guest material by using the plurality of first nozzles and the plurality of second nozzles, respectively, wherein a relative position of the substrate with respect to the plurality of vapor-deposition sources is changed in a direction orthogonal to the one direction during the formation of the EL layer;

removing the substrate from the film formation chamber after the EL layer is formed;

cleaning the adhesion preventing shield by removing the organic material deposited on the adhesion preventing shield in the film formation chamber after the substrate is removed; and exhausting the organic material from the film formation chamber during cleaning.

13. The method for manufacturing a device according to claim 12, wherein the organic material is removed by sublimating the organic material deposited on the adhesion preventing shield.

14. The method for manufacturing a device according to claim 12, wherein the organic material is removed by sublimating the organic material deposited on the adhesion preventing shield by heating.

15. The method according to claim 12, wherein the plurality of vapor-deposition sources move in the direction orthogonal to the one direction during the formation of the EL layer.

16. The method according to claim 12, wherein a plasma is formed in an exhaust treatment chamber during the exhausting of the sublimated organic material, and wherein the exhaust treatment chamber is connected with the film formation chamber.

17. A method of manufacturing a device, comprising the steps of:

disposing a substrate in a film formation chamber, wherein an adhesion preventing shield is provided in the film formation chamber to surround the substrate;

arranging a plurality of vapor-deposition sources along one direction in the film formation chamber, and wherein each of the plurality of vapor-deposition sources has a plurality of first nozzles and a plurality of second nozzles surrounded by the plurality of first nozzles;

forming an EL layer comprising an organic material including a host material and a guest material over the substrate by vapor-depositing the host material and the guest material by using the plurality of first nozzles and the plurality of second nozzles, respectively, wherein a relative position of the substrate with respect to the plurality of vapor-deposition sources is changed in a direction orthogonal to the one direction during the formation of the EL layer;

removing the substrate from the film formation chamber after the EL layer is formed;

cleaning the adhesion preventing shield by removing the organic material deposited on the adhesion preventing shield in the film formation chamber after the substrate is removed; and exhausting the organic material from the film formation chamber during cleaning, wherein an edge of the substrate is parallel with the one direction.

18. The method for manufacturing a device according to claim 17, wherein the organic material is removed by sublimating the organic material deposited on the adhesion preventing shield.

19. The method for manufacturing a device according to claim 17, wherein the organic material is removed by sublimating the organic material deposited on the adhesion preventing shield by heating.

20. The method according to claim 17, wherein the plurality of vapor-deposition sources move in the direction orthogonal to the one direction during the formation of the EL layer.

21. The method according to claim 17, wherein a plasma is formed in an exhaust treatment chamber during the exhausting of the sublimated organic material, and wherein the exhaust treatment chamber is connected with the film formation chamber.

* * * * *

UNITED STATES PATENT AND TRADEMARK OFFICE
CERTIFICATE OF CORRECTION

PATENT NO. : 8,815,331 B2
APPLICATION NO. : 13/449396
DATED : August 26, 2014
INVENTOR(S) : Shunpei Yamazaki et al.

It is certified that error appears in the above-identified patent and that said Letters Patent is hereby corrected as shown below:

In the Specification:

Col. 1, line 44, "utilises" should read --utilizes--

Col. 2, line 30, "inner wand" should read --inner wall of--

Col. 5, line 20, "sources .208" should read --sources 208--

Col. 5, line 57, "holder 2.05," should read --holder 205,--

Col. 10, line 64, "buster pump" should read --boster pump--

Col. 12, line 4, "chamber (ID) 906" should read --chamber (D) 906--

Col. 13, line 24, "chamber (B) 904;" should read --chamber (B) 904,--

Figure 13B:
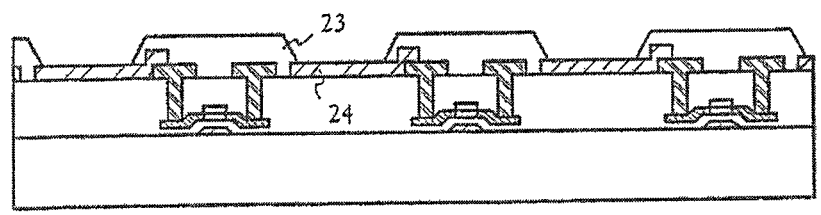
Figure 13C:
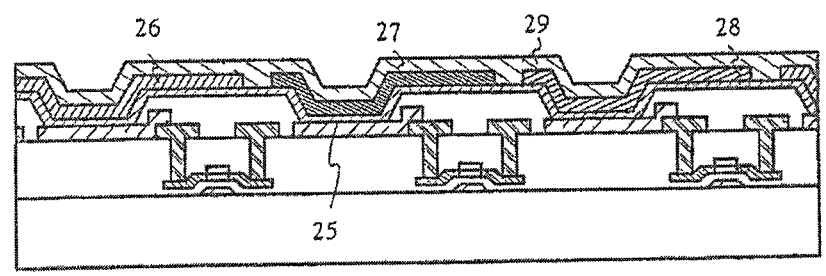

Col. 15, line 40, "FIGS. 13A-130," should read --FIGS. 13A-13C--

In the Claims:

Col. 17, line 33, Claim 12, "nozzles with and" should read --nozzles and--

Signed and Sealed this
Seventeenth Day of February, 2015

Michelle K. Lee
*Deputy Director of the United States Patent and Trademark Office*